United States Patent [19]

Rothenberger

[11] 4,251,863
[45] Feb. 17, 1981

[54] APPARATUS FOR CORRECTION OF MEMORY ERRORS

[75] Inventor: Roland D. Rothenberger, Apple Valley, Minn.

[73] Assignee: Sperry Corporation, New York, N.Y.

[21] Appl. No.: 8,803

[22] Filed: Mar. 15, 1979

[51] Int. Cl.³ .................... G06F 11/08; G11C 29/00
[52] U.S. Cl. ..................... 364/200; 371/21; 371/38
[58] Field of Search ... 364/900 MS File, 200 MS File; 371/13, 21, 38

[56] References Cited

U.S. PATENT DOCUMENTS

| | | | |
|---|---|---|---|
| 3,999,051 | 12/1976 | Petschauer . | |
| 4,031,374 | 6/1977 | Groudan et al. | 371/38 |
| 4,037,091 | 7/1977 | Beuscher | 371/13 |
| 4,139,148 | 2/1979 | Scheuneman et al. | 371/38 |
| 4,163,147 | 7/1979 | Scheuneman et al. | 371/38 |
| 4,175,692 | 11/1979 | Watanabe | 371/13 X |

OTHER PUBLICATIONS

Black, C. J. et al., "Development of a Space Borne Memory with a Single Error an Erasure Correction Scheme", 7th Ann. Int. Conf. on Fault Tolerant Computing by IEEE Comp. Soc., 1977, pp. 50–55.

Primary Examiner—Gareth D. Shaw
Assistant Examiner—Thomas M. Heckler
Attorney, Agent, or Firm—Kenneth T. Grace; William E. Cleaver; Marshall M. Truex

[57] ABSTRACT

Apparatus for correcting memory errors by testing the addressable location causing the memory error in real-time. The memory responds to read requests by accessing the contents of the requested addressable location. If the contents of the addressable location contain errors, which are uncorrectable by other means, the memory saves the erroneous data word and the requested addressable location is tested by immediately writing into and reading from the requested addressable location. Two data words are sequentially written into and read from the requested addressable location which cause both a one and a zero to be written into each bit position of the requested addressable location. If the reads reveal an error at any bit positions of the requested addressable location, the corresponding bit positions of the erroneous data word are complimented and the resultant is transferred to the requestor using the normal data path. A hold signal is generated to halt the requestor during the time required to test the requested addressable location and correct the erroneous data word.

4 Claims, 12 Drawing Figures

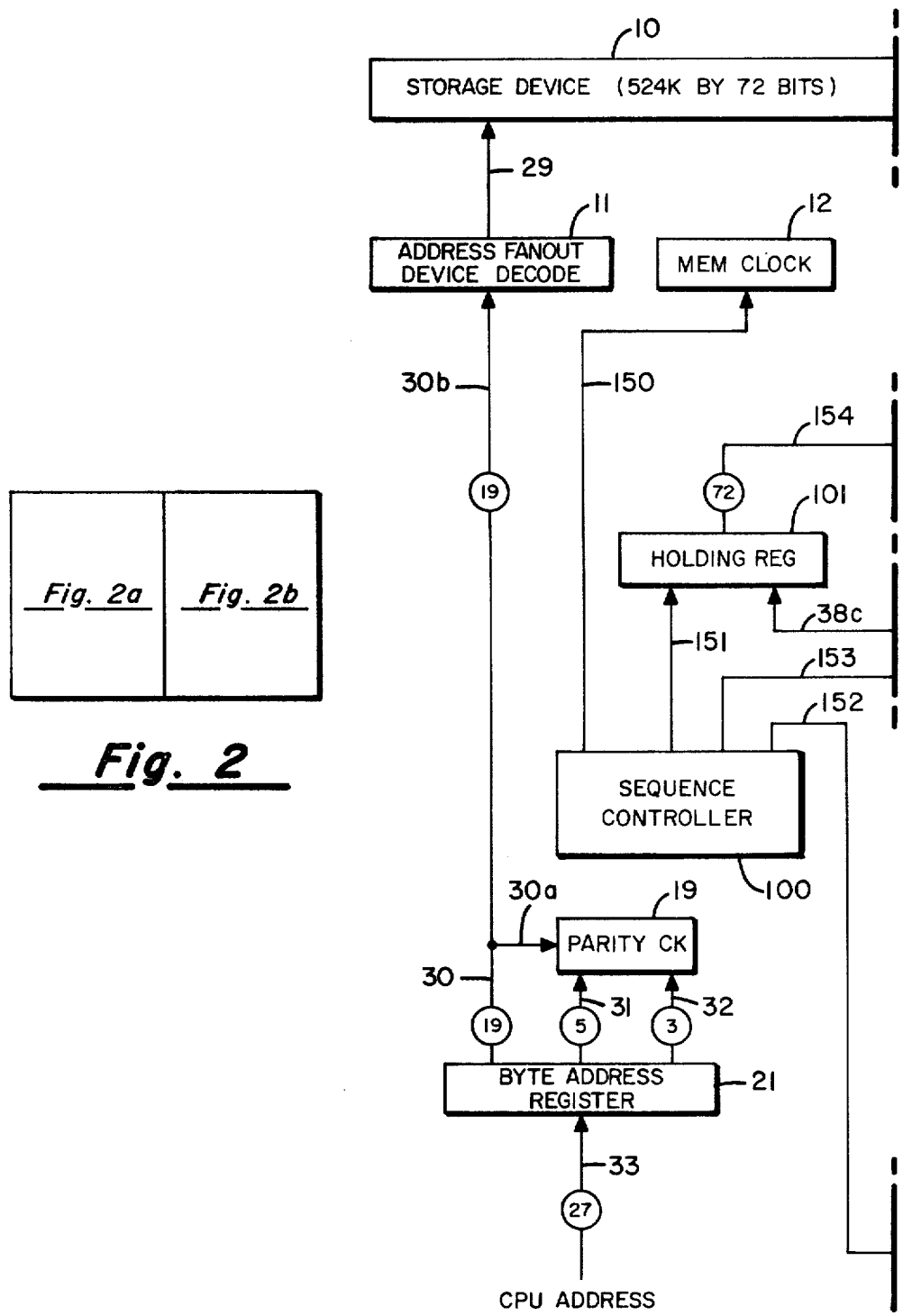

Fig. 5

| FOLLOWING STEP | CONTENTS OF READ DATA REGISTER | CONTENTS OF HOLDING REG | CONTENTS OF WR DATA REG MUX |
|---|---|---|---|
| 400 | 0 0 1 1 1 0 | x x x x x x | x x x x x x |
| 403 | 1 1 1 1 1 1 | 0 0 1 1 1 0 | 1 1 1 1 1 1 |
| 404 | 0 1 1 1 1 1 | 0 0 1 1 1 0 | 1 1 1 1 1 1 |
| 405 | 0 1 0 0 0 1 | 0 0 1 1 1 0 | 0 1 1 1 1 1 |
| 406 | 0 0 0 0 0 0 | 0 1 0 0 0 1 | 0 1 1 1 1 1 |
| 409 | 0 0 0 1 0 0 | 0 1 0 0 0 1 | 0 0 0 0 0 0 |
| 410 | 0 0 0 1 0 0 | 0 1 0 0 0 1 | 0 0 0 0 0 0 |
| 411 | | | 1 1 1 0 1 1 |
| 412 | 1 0 1 0 1 0 | 0 1 0 0 0 1 | 1 1 1 0 1 1 |

Fig. 6

| STEPS | SEQUENCE CONTROLLER | CYCLE TYPE | REMARKS |
|---|---|---|---|
| 300-303 | X | READ | NORMAL CPU READ |
| 399-400 | 0 | READ | RETRY READ |
| 400-403 | 1 | WRITE | WRITE ALL ONES |
| 404-409 | 2 | READ MODIFY WRITE | READ ALL ONES AND WRITE ALL ZEROES |
| 410-418 | 3 | READ MODIFY WRITE | READ ALL ZEROES AND WRITE CORRECTED DATA |

APPARATUS FOR CORRECTION OF MEMORY ERRORS

BACKGROUND OF THE INVENTION

The invention relates generally to memory systems and more specifically to correction of errors within memory systems.

Memory systems made using large scale integrated circuit techniques have proven to be cost effective for certain applications of storing digital data. Most memory systems are comprised of a plurality of similar storage devices or bit planes each of which is organized to contain as many storage cells or bits as feasible in order to reduce per bit costs and to also contain addressing and read and write circuits in order to minimize the number of connections to each storage device. Because of the one bit organization of the storage device, single bit error correction as described by Hamming in the publication "Error Detecting and Correcting Codes", R. W. Hamming, The Bell System Journal, Volume XXIX, April, 1950, No. 2, pp. 147-160 has proven quite effective in correcting the error of a single cell or bit in a given word, i.e., a single bit error, the word being of a size equal to the word size of the memory system. This increases the effective mean time between failure (MTBF) of the memory system.

Because the storage devices are quite complex, and because many are used in a memory system, they usually represent the predominant failure in a memory system. Consequently, it is common practice to employ some form of single bit error correction along the lines described in Hamming. While single bit error correction allows for tolerance of single bit failures, as more of them fail, the statistical chance of finding two of them, i.e., a double bit error, in the same word increases with the errors being left to accumulate in the system. While the method to accomplish double bit error correction as suggested by Hamming has been known in the art for some time, the cost of the additional circuitry required has made the technique economically unfeasible for most commercial applications.

Considerable research has been directed toward solving the problem of multiple bit error correction as the economics of the semiconductor technology tend to force the utilization of larger and larger storage devices containing malfunctions for individual bits.

Many techniques are known which accomplish multiple bit error correction in memory systems utilizing single bit error correction as taught by Hamming. One such technique is taught by J. H. Scheuneman, et al, in pending United States Patent Application Serial No. 871,048, now U.S. Pat No. 4,163,147, assigned to the assignee of the present invention. J. H. Scheuneman, et al, teach the complementing of all combinations of two bit positions of the erroneous data word until the single bit error correction circuitry of the memory system indicate no error (or a correctable single bit error) is present. For a memory system having a word size of N bits, however, as many as N(N-1)/2 iterations of the complementing process may be required.

This may require a long time to correct errors in memory systems having a large word size (i.e., N is large).

A second technique is taught by J. H. Scheuneman, et al, in pending U.S. Application Ser. No. 827,540, now U.S. Pat. No. 4,139,148, also assigned to the assignee of the present invention. J. H. Scheuneman, et al, herein teach the storing or logging of the syndrome bits of a single bit (correctable) error in a location corresponding to the addressable location wherein that single bit error was observed. A subsequent second failing bit position at the same addressable location may then be corrected by the single bit error correction circuitry after first complementing the initial failing bit position as identified by the stored syndrome bits. This technique though faster requires a substantial amount of additional storage capacity to store the syndrome bits for each addressable location. The technique furthermore assumes that the multiple bit errors are not first observed on a single read cycle.

A similar technique is taught in publication, "Development of a Space Borne Memory with a Single Error and Erasure Correction Scheme," C. J. Black, et al, published at the 7th Annual International Conference on Fault Tolerant Computing by the IEEE Computer Society, Los Angeles, California, June 28-30, 1977, Pages 50 through 55. Whereas C. J. Black, et al, teach storage of the syndrome bits in nondedicated memory reducing the total additional memory requirement, this savings probably substantially reduces the reliability of the technique because it restricts the number of addressable locations for which multiple bit errors may be corrected.

A number of techniques are also employed which are intended to prevent the occurrance of or forecast multiple bit errors. R. D. Rothenberger in pending U.S. Patent Application, Ser. No. 886,362, now abandoned also assigned to the assignee of the present invention, teaches the relocation of data from those addressable locations identified to contain an error thereby attempting to prevent multiple bit errors. This technique does require additional memory capacity for the relocated data, however, and assumes that single bit errors will be observed at an addressable location before a multiple bit error occurs.

Error logging is the technique used to attempt forecasting of multiple bit errors. Petschauer in U.S. Pat. No. 3,999,051 describes such an error logging scheme. Error logging does not, however, correct multiple bit errors.

The present invention provides actual multiple bit error correction utilizing a minimum of additional hardware within a minimum amount of time.

SUMMARY OF THE INVENTION

The present invention corrects multiple bit errors by immediately testing an addressable location after the observation of a multiple bit error and correcting the erroneous data word based upon the results of that testing. In operation, if a multiple bit error is observed during a read access to the memory system, the requestor (i.e., central processing unit, etc.) is halted to provide the additional time required to test the failing addressable location after the observation of a multiple bit error and to correct the erroneous data word. The addressable location is again read to determine if the failure is solid (i.e., repeatable). If the second read produces an error free or correctable data word (i.e., data word containing a single bit error correctable using the single bit error correction circuitry), the data word is provided to the requestor and normal operation resumes. If the second read again produces an erroneous data word, containing a multiple bit error, the erroneous data word is saved and a first test data word is written into and read from the addressable location bypassing the single bit error correction circuitry. Those bit positions of the erroneous data word are complimented corresponding to the bit position of the first test data word modified by being written into and from the addressable location. A second test data word (i.e., compliment of the first test data word) is written into and read from the addressable location again bypassing the single bit error correction circuitry. Those bit positions of the erroneous data word are complimented corresponding to the bit positions of the second test data word modified by being written into and read from the addressable location. The erroneous data word so modified is again tested by the single bit error correction circuitry. If it no longer contains a multiple bit error, the modified erroneous data word is written into the addressable location and supplied to the requestor and normal operation resumes. If the erroneous data word still contains a multiple bit error, the requestor is notified via priority interrupt of an uncorrectable read error.

BRIEF DESCRIPTION OF THE DRAWINGS

FIGS. 2a and 2b, connected as shown in FIG. 2, show the interface circuitry of the memory system containing the preferred embodiment of the present invention.

FIG. 5 is a table showing the states of six bit positions of the critical registers of the preferred embodiment of the present invention.

FIG. 6 is a table of the memory cycles employed during multiple bit error correction.

DETAILED DESCRIPTION OF THE PREFERRED EMBODIMENT

The preferred embodiment of the present invention is described in relation to the Sperry Univac ™ 90/80 computer system having a memory which contains error correction circuitry (ECC) for single bit error correction/double bit error detection. Therefore, the details of the interface logic and timing as described will be most applicable to that computer system. However, those skilled in the art will be able to readily apply the present invention to computer systems having different interface logic and timing characteristics.

Figure 1:
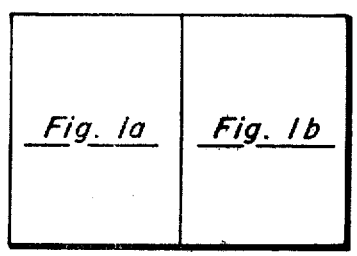
FIGS. 1a and 1b, connected as shown in FIG. 1, show the prior art interface circuitry of the memory system.

FIG. 1 shows the prior art interface between the memory system and the central processing unit, CPU. In the preferred embodiment, STORAGE DEVICE 10 has the capacity to store up to $2^{19}$ data words of 72 bits each. That is, STORAGE DEVICE 10 contains $2^{19}$ addressable locations wherein each addressable location has 72 bit positions. The CPU supplies a 27 bit address via line 33 to BYTE ADDRESS REGISTER 21. The 19 bits of the 27 bit address required to uniquely address one of the $2^{19}$ addressable locations is transferred to ADDRESS FANOUT DEVICE DECODE 11 via line 30 (and line 30b). Parity checker, PARITY Ck 19, uses the remaining 8 bits of the 27 bit address received via lines 31 and 32, along with the 19 bits received via line 30a to check for proper receipt of a correct address. ADDRESS FANOUT DEVICE DECODE 11 uses the 19 bit address received via line 30b to address the one desired addressable location of STORAGE DEVICE 10 via line 29. Actually, ADDRESS FANOUT DEVICE DECODE 11 is quite complex in that the $2^{14}$ bit MNOS semiconductors used in STORAGE DEVICE 10 have some unique timing requirements which are well known in the art and will not be discussed further, herein.

For a write access, the CPU supplies a 72 bit write data word to the 1 or 2 write data multiplexer, 1 of 2 WR DATA MUX 23, via line 47. The 72 bit write data word actually contains eight bytes of eight bits each with one parity bit for each byte. The exercisor data generator, EXERCISOR DATA GEN 22, supplies test data bytes to 1 OF 2 WR DATA MUX 23 via line 46. These test data bytes may be all ones, all zeroes, alternating ones, etc. EXERCISOR DATA GEN 22 is normally used in the maintenance mode to test STORAGE DEVICE 10. A single test data byte of eight bits with one parity bit is supplied via line 46 to 1 OF 2 WR DATA MUX 23. The single test data byte is repeated at all eight byte positions should 1 OF 2 WR DATA MUX 23 select the output of EXERCISOR DATA GEN 22 for transfer to the write data register multiplexer, WR DATA REG MUX 20. During a normal write access by the CPU, however, 1 OF 2 WR DATA MUX 23 selects the 72 bit write data word received via line 47 for transfer to WR DATA REG MUX 20 via line 45.

WR DATA MUX 20 is a 72 bit position register having the capability of latching individual bytes from line 45 and line 40b. This permits the memory system to read an addressable location, transfer all eight bytes (without parity or check bits) to WR DATA REG MUX via line 40b, and permit the CPU to modify fewer than all eight bytes of the addressable locations. This function, called read-modify-write, is further discussed below. Parity checker, PARITY CK 18, receives the eight partity bits via line 44 and the 64 data bits via line 43a and checks for a proper parity condition.

The 1 of 2 read register multiplexer, 1 OF 2 READ 1 OF 2 REG MUX 16, selects the input of READ DATA REGISTER 15. 1 OF 2 READ REG MUX 16 either transfers the 64 bits received via line 43b to READ DATA REGISTER 15 via line 42 of transfers the 72 bits received via line 34 to READ DATA REGISTER 15 via line 41. During the normal write access, READ DATA REGISTER 15 receives the 64 bits transferred via line 42.

During the normal write access, the 64 data bits are transferred from READ DATA REGISTER 15 to the read/write decode bit error decoder, RD/RW DECODE BIT ERR DECODE 14 via line 39b and then to the desired addressable location of of STORAGE DEVICE 10 via line 37. The 64 data bits are also supplied via line 39a to the error correction circuitry generator/decoder, ECC GENERATOR/DECODER 13, where the eight coding bits are generated (see Hamming reference) and transferred to the desired addressable location of STORAGE DEVICE 10 via line 35. This completes the normal write access.

The address for a normal read access is handled in the same manner as for a normal write access as described above. The 72 bits of the addressed one of the $2^{19}$ addressable locations of STORAGE DEVICE 10 are transferred to 1 OF 2 READ REG MUX 16 via line 34. During a normal read access, 1 OF 2 READ REG MUX 16 transfers the 72 bits received via line 34 to READ DATA REGISTER 15 via line 41. The 64 data bits (i.e., the 72 bit contents of the addressable location of STORAGE DEVICE 10 minus the eight coding bits) are transferred to RD/WR DECODE BIT ERR DECODE 14 via line 39b. The eight coding bits are transferred to RD/WR DECODE BIT ERR DECODE 14 via line 36 as received from ECC GENERATOR/DECODER 13 which receives the entire 72 bits via line 38. Any single bit error present in the 64 data bits is detected and corrected by RD/WR DECODE BIT ERR DECODE 14. The corrected 64 data bits are transferred via line 40a to INSERT PARITY 17 wherein a parity bit is generated and inserted for each eight bit byte. The resultant 72 bit read data word is transferred to the CPU via line 48 thus completing the normal read access.

Figure 2B:
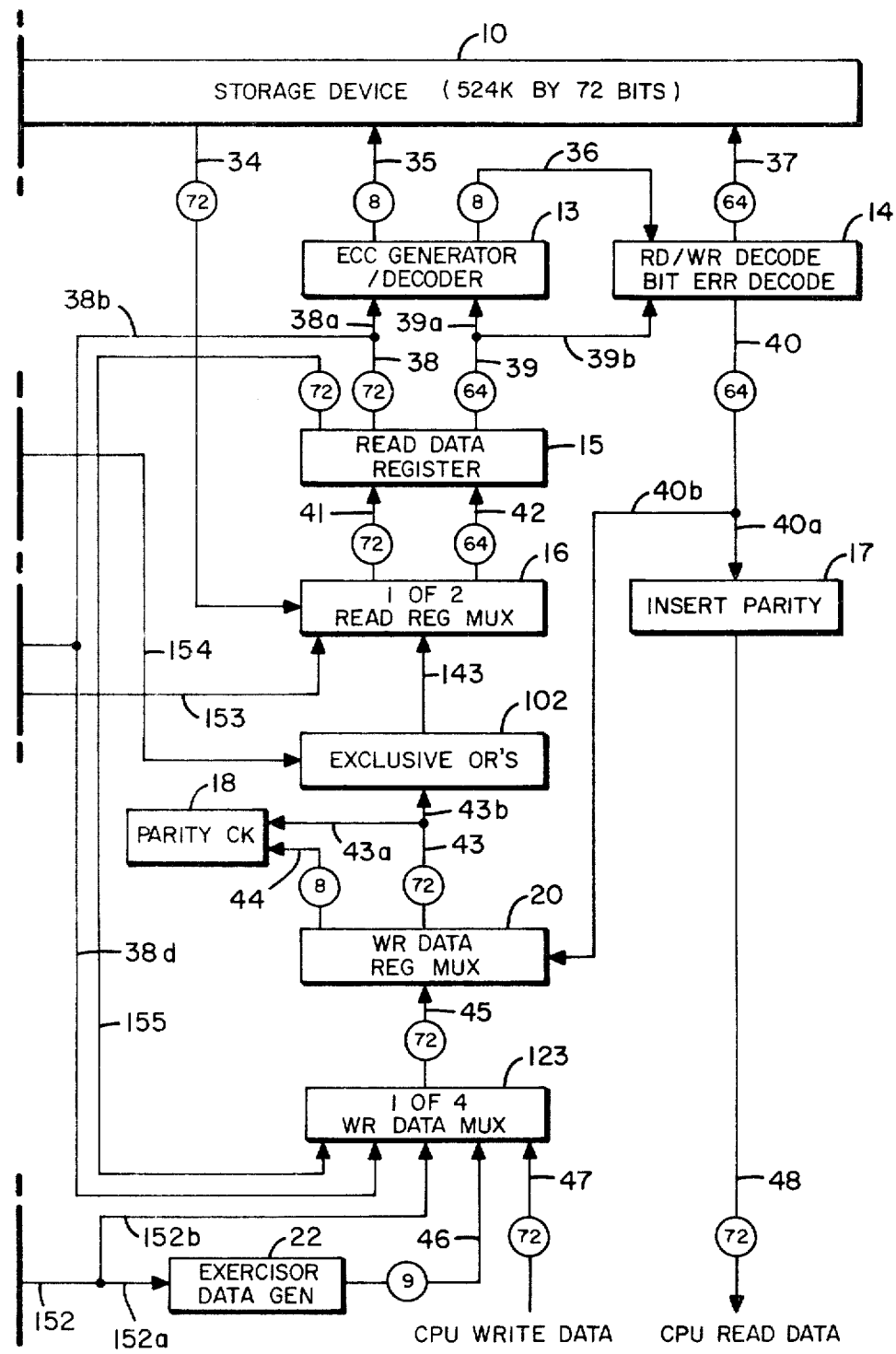

FIG. 2 shows the same prior art memory system interface modified to incorporate the present invention. Three additional hardware elements, SEQUENCE CONTROLLER 100, HOLDING REGISTER 101, and EXCLUSIVE OR's 102, are required to implement the present invention. Also 1 OF 2 WR DATA MUX 23 is replaced with a four input multiplexer, 1 OF 4 WR DATA MUX 123. Line 43 is expanded from 64 bits as explained below.

SEQUENCE CONTROLLER 100 is a simple four step controller. That is, SEQUENCE CONTROLLER 100 has four states. The table in FIG. 6 under SEQUENCE CONTROLLER shows the four states of 0, 1, 2, and 3 along with X which is the normal read cycle. As shown in the CYCLE TYPE column, state 0→READ, state 1→WRITE, state 2→READ MODIFY WRITE, and state 3→READ MODIFY WRITE. Each of the three cycle types (i.e., READ, WRITE, and READ MODIFY WRITE) is a clearly defined function of the chosen memory system wherein the normal READ cycle takes 400 nanoseconds, the normal WRITE cycle takes 400 nanoseconds, and the normal READ MODIFY WRITE cycle takes 560 nanoseconds. Therefore, SEQUENCE CONTROLLER 100 requires 2,320 (i.e., 400+400+560+560) nanoseconds to complete all four states (i.e., state 0, state 1, state 2, and state 3). Referring again to FIG. 2, SEQUENCE CONTROLLER 100 signals the memory clock, MEM CLOCK 12, via line 150 to perform the sequence READ cycle (i.e., state 0), WRITE cycle (i.e., state 1), READ MODIFY WRITE cycle (i.e., state 2), and READ MODIFY WRITE cycle (i.e, state 3). SEQUENCE CONTROLLER 100 controls the gating of data into the holding register, HOLDING REG 101, via line 151. SEQUENCE CONTROLLER 100 controls the output of EXERCISOR DATA GEN 22 via line 152a and the output of 1 OF 4 WR DATA MUX 123 via line 152b. SEQUENCE CONTROLLER 100 also controls the output of 1 OF 2 READ REG MUX 16 via line 153. These functions of SEQUENCE CONTROLLER 100 will become more clear as the operation of the present invention is described below.

HOLDING REG 101 is a 72 bit register. The 72 bits received via line 38c from READ DATA REGISTER 15 are saved in HOLDING REG 101 when enabled by the enable signal received from SEQUENCE CONTROLLER 100 via line 151. The 72 bit contents of HOLDING REG 101 are supplied to EXCLUSIVE OR's 102 via line 154.

EXCLUSIVE OR's 102 is actually comprised of 72 individual exclusive-or circuits with one such circuit dedicated to each of the 72 bit positions of lines 154 and 43b. The 72 bit exclusive-or output of EXCLUSIVE OR's 102 is transferred via line 143 to 1 OF 2 READ REG MUX 16. For example, bit position zero (i.e., $2^0$) of line 143 is a binary one if and only if bit position zero of line 154 is a binary one and bit position zero of line 43b is a binary zero or bit position zero of line 154 is a binary zero and bit position zero of line 43b is a binary one. Bit position zero of line 143 is a binary zero if bit position zero of both lines 154 and 43b is either binary zero or binary one. The 71 remaining bit positions of the output of EXCLUSIVE OR's 102 (i.e., line 143) are similarly determined. As can be seen from further discussion below, exclusive-oring of the entire 72 bits permits correction of errors at the bit positions of the eight coding bits as well as the bit positions of the 64 data bits. Notice that during a normal write access HOLDING REG 101 must contain binary zeroes at all 64 data bit positions to enable proper data transfer from WR DATA REG MUX 20 to 1 OF 2 READ REG MUX 16. Since the eight coding bits are added subsequently by ECC GENERATOR/DECODER 13 during a normal write access, the contents of the remaining eight bit positions of HOLDING REG 101 are not relevant. See above.

The write data multiplexer (i.e., 1 OF 2 WR DATA MUX 23 on FIG. 1) is increased to four inputs and is shown as 1 OF 4 WR DATA MUX 123 on FIG. 2. This is necessary in the preferred embodiment of the present invention to permit selection of the output of READ DATA REGISTER 15 received via line 38d or the compliment output of READ DATA REGISTER 15 received via line 155, for transfer to WR DATA REG MUX 20 via line 45, as well, as the write data word received from the CPU via line 47 and EXERCISOR DATA GEN 22 output received via line 46.

Figure 3A:
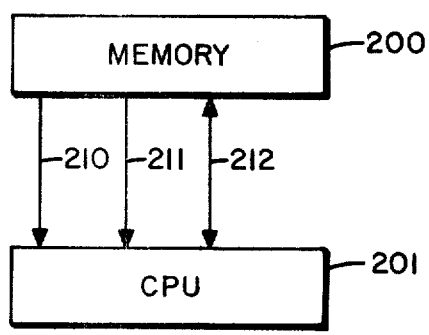
FIG. 3a shows the prior art computer with significant control signal lines highlighted.

FIG. 3a provides a simplified view of the prior art control interface between CPU 201 and MEMORY 200. Bidirectional line 212 represents those conductors required to control the transfers of address, read, and write data words. Line 210 is a single conductor for transfer of the single bit error signal, SBE flag. If during a normal read access an error is detected by MEMORY 200, SBE flag is transferred from MEMORY 200 to CPU 201 via line 210. SBE flag causes CPU 201 to halt for a fixed period of time (i.e., 60 nanoseconds in the Sperry Univac TM 90/80 computer system) to enable MEMORY 200 to perform single bit error correction. Should a multiple bit error be detected during a normal read access, MEMORY 200 transfers a cycle error signal, CE flag, to CPU 201. CE flag signals CPU 201 that MEMORY 200 has encountered an error which it cannot correct and CPU 201 must recover using software means.

Figure 3B:
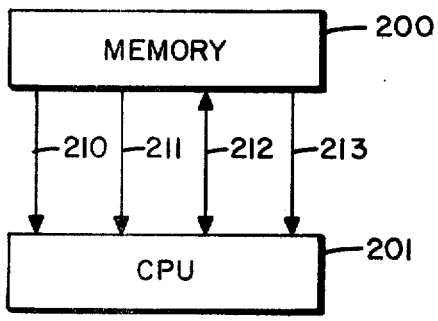
FIG. 3b shows the computer incorporating the preferred embodiment of the present invention.
Figure 1A:
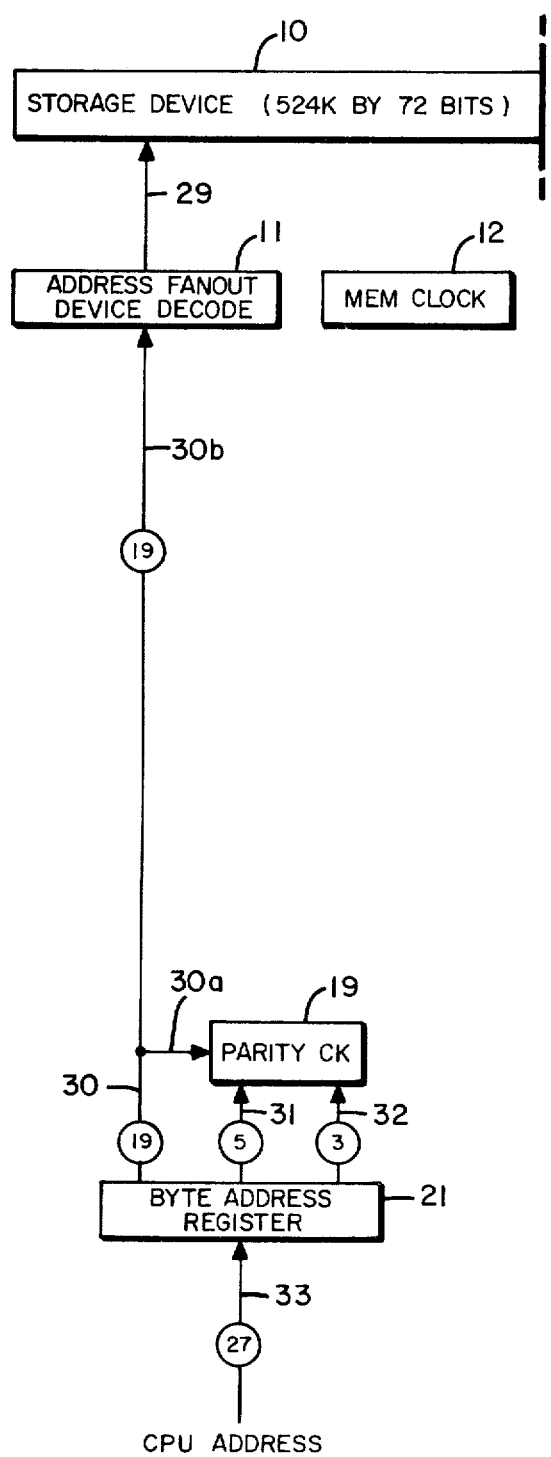
Figure 1B:
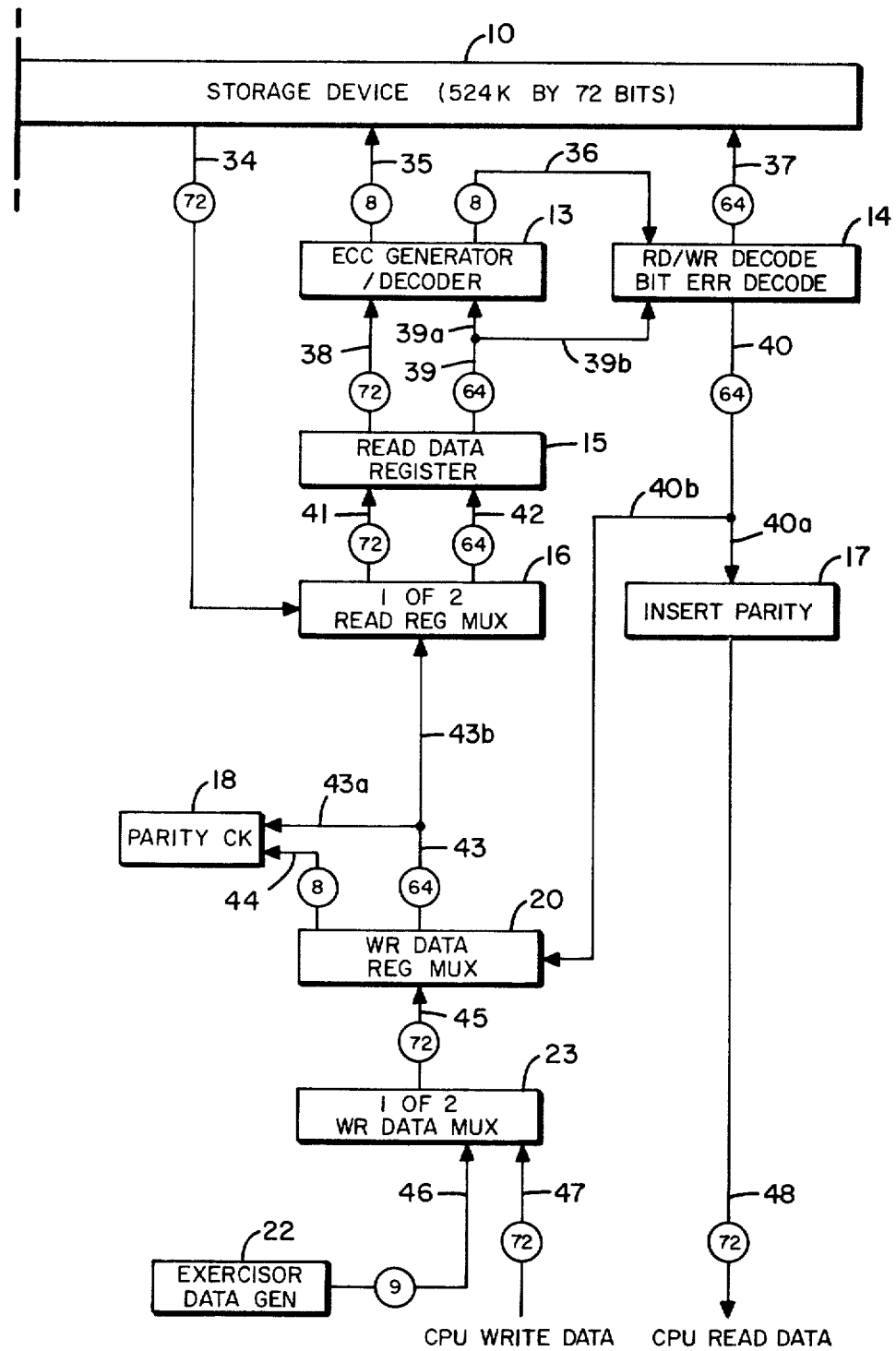

FIG. 3b shows the same interface modified to utilize the present invention. The single conductor represented as line 213 has been added. MEMORY 200 uses line 213 to transfer a double bit error signal, DBE flag, to CPU 201. DBE flag is generated by MEMORY 200 whenever a multiple bit error is encountered. DBE flag, like SBE flag, causes CPU 201 to halt for a fixed period of time. In the preferred embodiment, DBE flag causes CPU 201 to halt for 2,320 nanoseconds (see above for computations). Line 210 and SBE flag function exactly as described above. CE flag, however, is not generated for any multiple bit error as in the prior art but is only generated for multiple bit errors not correctable by the present invention. The timing of SBE flag, DBE flag, and CE flag are discussed in more detail below.

Figure 4A:
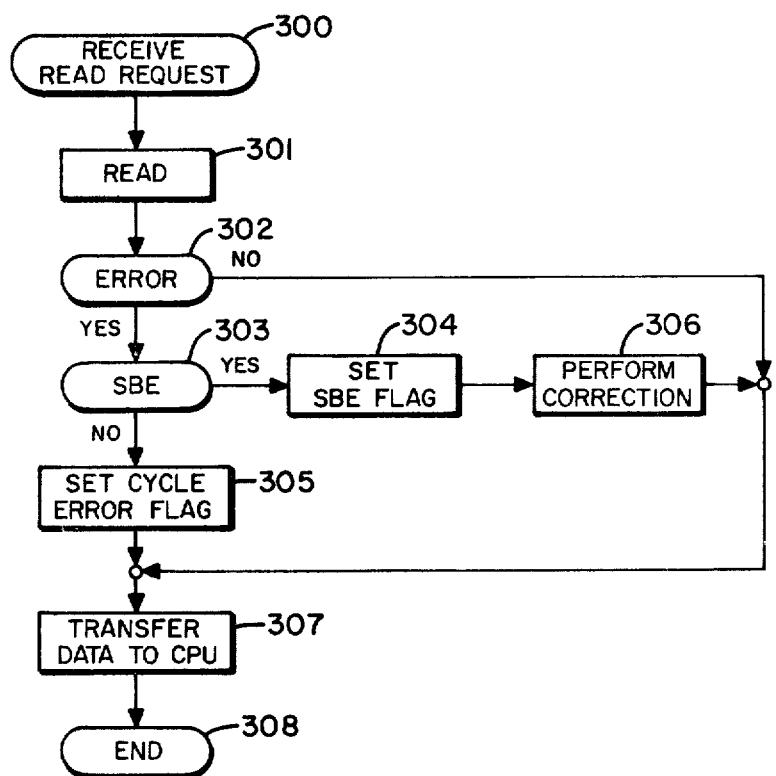
FIG. 4a provides a flowchart of a prior art read access.

FIG. 4a shows the error detection and error correction steps in the prior art Sperry Univac TM 90/80 computer system. As the sequence of operation is discussed, it may be helpful to refer back to FIG. 1 on occasion to review the corresponding hardware structure. The read access request is received from the CPU at element 300. The actual reading of the appropriate addressable location of STORAGE DEVICE 10 is accomplished at element 301. At element 302 an error check is made using the eight coding bits. If no error is found, the process continues at element 307 with the transfer of the data to the CPU. The normal read access is then complete at element 308. Should an error be found, however, a determination of whether the error is a single bit error is made at element 303. If the error is a single bit error, SBE flag is set causing the CPU to halt for 60 nanoseconds at element 304 and the single bit error correction is performed at element 306. If it is determined at element 303 that the error is not a single bit error, CE flag is set at element 305 notifying the CPU that software recovery procedures must be instituted.

Figure 4B:
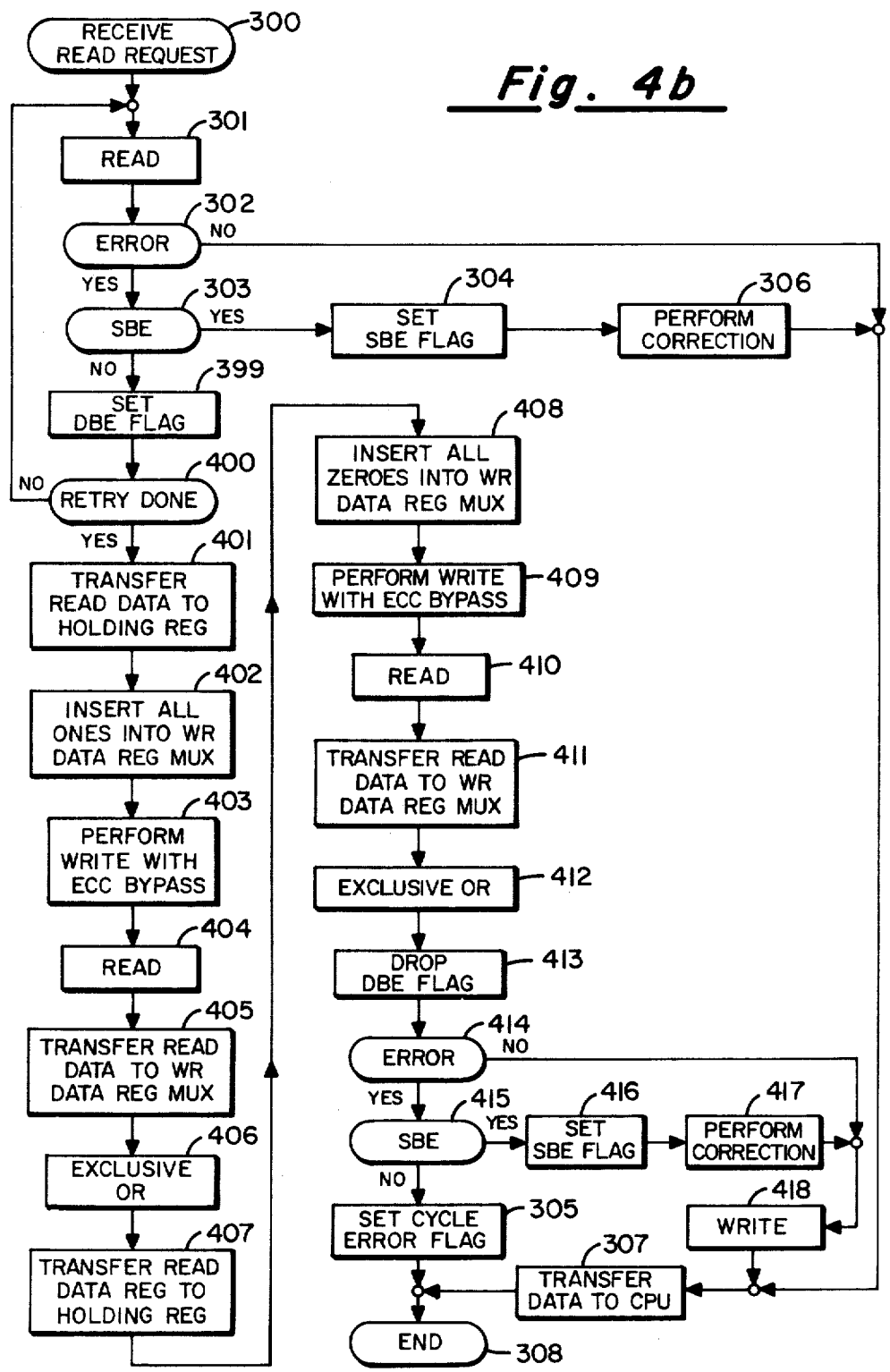
FIG. 4b provides a flowchart of a read access in a computer employing the present invention.

FIG. 4b shows the additional steps added to incorporate the present invention. To fully understand the operation of the present invention the reader may wish to refer also to FIG. 2. Elements 300, 301, 302, 303, 304, 305, 306, 307 and 308 are exactly as described above. After element 303 determines that the error detected is not a single bit error, element 399 sets DBE flag causing the CPU to halt 2,320 nanoseconds. As explained above, this provides the time required for the performance of the additional steps to correct multiple bit errors in accordance with the present invention. A retry is initiated at element 400. This retry merely rereads the same addressable location to again test for presence of a multiple bit error. If the reread produces no multiple bit error, the remainder of the steps are as previously described. If a multiple bit error is still present, the 72 bit read data word obtained from the reread is transferred to HOLDING REG 101 via line 38c at element 401. At element 402, EXERCISOR DATA GEN 22 generates all ones on command from SEQUENCE CONTROLLER 100. The output of EXERCISOR DATA GEN 22 is transferred to 1 OF 4 WR DATA MUX 123 via line 46 and enabled on command from SEQUENCE CONTROLLER 100 via line 152b into WR DATA REG MUX 20 via line 45. WR DATA REG MUX 20 now contains a binary one at each of its 72 bit positions. The contents of WR DATA MUX 20 (i.e., all binary ones) are written into the addressable location containing the multiple bit error as described above. However, as indicated at element 403, this write is accomplished bypassing the normal Error Correction Circuitry (i.e., ECC). This is accomplished by ECC GENERATOR/DECODER 13 supplying binary ones at all eight bit positions of line 35 rather than the generated eight coding bits as in the case of a normal write access. The Write with ECC bypass is a function commonly used for test purposes on the Sperry Univac TM 90/80 computer system and similar computer systems.

A read of the addressable location of STORAGE DEVICE 10 containing the multiple bit error is accomplished at element 404. The 72 bit read data word is transferred to 1 OF 2 READ REG MUX 16 via line 34 and then to READ DATA REGISTER 15 via line 41 as with the normal read access. Differing from the normal read access, however, the 72 bit read data word is transferred to 1 OF 4 WR DATA MUX 123 via line 38d and then to WR DATA REG MUX 20 via line 45 as indicated at element 405. At element 406 the contents of WR DATA REG MUX 20 is exclusive-ored with the contents of HOLDING REG 101 (i.e., the original 72 bit contents of the addressable location of STORAGE DEVICE 10 containing the multiple bit error). The two 72 bit words are exclusive-ored within EXCLUSIVE OR's 102 as explained above. The 72 bit output of EXCLUSIVE OR's 102 is transferred to 1 OF 2 READ REG MUX 16 via line 143 and then to READ DATA REGISTER 15 via line 41. As indicated at element 407, the 72 bit contents of READ DATA REGISTER 15 are then transferred to HOLDING REG 101. HOLDING REG 101 now contains the original 72 bit contents of the addressable location of STORAGE DEVICE 10 containing the multiple bit error exclusive-ored with the 72 bit resultant of reading from that same addressable location after writing binary ones at all 72 bit positions.

Similarly, EXERCISOR DATA GEN 22 supplies all zeroes under command from SEQUENCE CONTROLLER 100 to 1 OF 4 WR DATA MUX 123 via line 46 and then to WR DATA REG MUX 20 via line 45. WR DATA REG MUX 20 now contains a binary zero at all 72 bit positions as indicated at element 408. At element 409 the write with ECC bypass is again performed. The addressable location of STORAGE DEVICE 10 containing the multiple bit error is read as before as shown at element 410. The compliment of the 72 bit read data word is transferred via line 155 to WR DATA REG MUX 20, as indicated at element 411. Selection of the complement is done under the command of SEQUENCE CONTROLLER 100 received via line 152b. The 72 bit contents of HOLDING REG 101 are again exclusive-ored with the 72 bit contents of WR DATA REG MUX 20 as indicated at element 412 with the output of EXCLUSIVE OR's 102 being transferred to 1 OF 2 READ REG MUX 16 via line 143 and then to READ DATA REGISTER 15 via line 41.

READ DATA REGISTER 15 now contains the 72 bit corrected read data word. It has been generated by testing the addressable location of STORAGE DEVICE 10 containing the multiple bit error (i.e., writing all binary ones into the addressable location and reading from it followed by writing all binary zeroes into the addressable location and reading from it) and correcting the original 72 bit read data word containing the multiple bit error by exclusive-oring it with the results of the testing (i.e., read data word generated following the writing of all binary ones and then compliment of the read data word generated following the writing of all binary zeroes).

DBE flag is dropped at element 413 after the passage of 2,320 nanoseconds allowing the CPU to restart. The 72 bit corrected read data word undergoes error detection at element 414 as with a normal read access as described above. If RD/WR DECODE BIT ERR DECODE 14 finds an error in the corrected read data word (at element 414) and the error is not a single bit error (at element 415), CE (cycle error) flag is generated as in the prior art system as shown at element 305. If RD/WR DECODE BIT ERR DECODE 14 finds an error in the corrected read data word (at element 414) and the error is a single bit error (at element 415), SBE flag is set at element 416 and the single bit error is corrected at element 417 as in the prior art system. The corrected read data word is rewritten into the addressable location of STORAGE DEVICE 10 containing the multiple bit error as indicated at element 418. This increases the probability that multiple bit error correction could again be accomplished at the same addressable location should the need arise. The 64 bits of data within the corrected read data word have parity added at INSERT PARITY 17 and are supplied to the CPU 10 via line 48 as indicated by element 307.

FIG. 5 shows the contents of the relevant registers during the multiple bit error correction functions performed from element 400 to element 413 of FIG. 4b. To greatly simplify the example, only six bit positions of each register are shown. The multiple bit error is contained within these six bit positions and the reader is to assume that no errors are present within the remaining bit positions. The three registers of concern are READ DATA REGISTER 15, HOLDING REG 101, and WR DATA REG MUX 20. For ease of understanding, the element numbers of FIG. 4b are supplied. The contents of the three registers shown are after completion of the function at the corresponding element number. It is assumed in the example that the retry at element 400 has already been performed and a multiple bit error is still present.

If we number the bit positions from left to right as $2^0$, $2^1$, $2^2$, $2^3$, $2^4$, and $2^5$, we can see the contents of READ DATA REGISTER 15 following element 400 has a multiple bit error wherein bit positions $2^0$ should be a binary one (i.e., addressable location has stuck-at-zero condition at bit position $2^0$) and bit position $2^3$ should be a binary zero (i.e., addressable location has a stuck-at-one condition at bit position $2^3$). The contents of HOLDING REG 101 and WR DATA REG MUX 20 are not important at this time. The initial write is performed at element 403 using all binary ones. HOLDING REG 101 now contains the original read data word containing the multiple bit error which was transferred from READ DATA REGISTER 15 at element 401. WR DATA REG MUX 20 contains all binary ones received at element 402. READ DATA REGISTER 15 also contains all binary ones as a result of the write with ECC bypass performed at element 403.

Read is performed at element 404 leaving HOLDING REG 101 and WR DATA REG MUX 20 unchanged. READ DATA REGISTER 15, however, contains the new read data word obtained after writing all binary ones into the addressable location of STORAGE DEVICE 10 containing the multiple bit error. If that addressable location has a stuck-at-zero condition at bit position $2^0$, the result of the read is as shown for the contents of READ DATA REGISTER 15. That is all bit positions of READ DATA REGISTER 15 contain binary ones except bit position $2^0$ because that bit position of the addressable location is stuck-at-zero. The new read data word (i.e., contents of READ DATA REGISTER 15) is transferred to WR DATA REG MUX 20 at element 405. HOLDING REG 101 remains unchanged. The contents of HOLDING REG 101 and WR DATA REG MUX 20 are exclusive-ored at element 406 with the resultant transferred to READ DATA REGISTER 15 as shown.

The contents of READ DATA REGISTER 15 are transferred to HOLDING REG 101 at element 407. All binary zeroes are loaded into WR DATA REG MUX 20 at element 408. As a result of the write with ECC bypass at element 409, READ DATA REGISTER 15 also contains all binary zeroes. A read is again performed at element 410 with the new read data word transferred to READ DATA REGISTER 15. Note that all bit positions of READ DATA REGISTER 15 contain binary zeroes except bit position $2^3$, which contains a binary one because the addressable location of STORAGE DEVICE 10 containing the multiple bit error has a stuck-at-one condition at bit position $2^3$. HOLDING REG 101 and WR DATA REG MUX 20 remain unchanged. The compliment of the contents of READ DATA REGISTER 15 is transferred to WR DATA REG MUX 20 at element 411. At element 412 the corrected read data word is formed by the exclusive-or of the contents of HOLDING REG 101 and the contents of WR DATA REG MUX 20. The corrected read data word is transferred to READ DATA REGISTER 15.

FIG. 6 shows the relationship between the elements of FIG. 4b and the steps of SEQUENCE CONTROLLER 100 during multiple bit error correction. The corresponding type of cycles of the Sperry Univac ™ 90/80 computer system memory are shown to provide correlation with the discussion of SEQUENCE CONTROLLER 100 provided above.

What is claimed is:

1. In a computer having a central processing unit and having a memory coupled to said central processing unit containing a plurality of addressable locations from which said central processing unit may read, wherein each of said plurality of addressable locations has a plurality of bit positions, and having means responsively coupled to said memory and said central processing unit for detecting errors in the data read by said central processing unit from a one of said plurality of addressable locations, the improvement comprising:

means responsively coupled to said memory and said detection means for generating a first test data word and for generating a second test data word wherein said second test data word is the compliment of said first test data word;

means responsively coupled to said memory and said generating means for writing said first test data word and said second test data word into said one of said plurality of addressable locations;

means responsively coupled to said memory for reading from said one of said plurality of addressable locations;

means responsively coupled to said reading means for temporarily storing the data as read from said one of said plurality of addressable location;

first control means responsively coupled to said detecting means, said memory, said central processing unit, said generating means, said writing means, said reading means, and said temporarily storing means for sequentially causing said temporarily storing means to temporarily store said data as read from said one of said plurality of addressable locations, said generating means to generate said first test data word, said writing means to write said first test data word into said one of said plurality of addressable locations, said reading means to read the contents of said one of said plurality of addressable locations, said generating means to generate said second test data word, said writing means to write said second test data word into said one of said plurality of addressable locations, said reading means to read the contents of said one of said plurality of addressable locations, and said temporarily storing means to temporarily store said contents of said one of said plurality of addressable locations;

a holding register responsively coupled to said temporarily storing means, said memory, and said reading means;

means responsively coupled to said temporarily storing means and said holding register for exclusive-ORing the contents of said temporarily storing means with the contents of said holding register and storing a resultant in said holding register; and second control means responsively coupled to said first control means, said detecting means, said temporarily storing means, said exclusive-ORing means, and said holding register for sequentially causing, upon detection of said error in said data read from said one of said plurality of addressable locations, said holding register to be cleared, said exclusive-ORing means to exclusive-OR the contents of said temporarily storing means with the contents of said holding register immediately before said first control means has caused said writing means to write said second test data word into said one of said plurality of addressable locations, and said exclusive-ORing means to exclusive-OR the compliment of the contents of said temporarily storing means with the contents of said holding register immediately after said first control means has caused said writing means to write said second test data word into said one of said plurality of addressable locations, said reading means to read the contents of said one of said plurality of addressable locations, and said temporarily storing means to temporarily store said contents of said one of said plurality of addressable locations producing said corrected data word.

2. A computer according to claim 1 wherein said second control means further comprises:

means responsively coupled to said central processing unit for holding said central processing unit until said corrected data word is produced.

3. In a computer having a central processing unit and having a memory coupled to said central processing unit containing a plurality of addressable locations wherein each of said addressable locations contains a plurality of bit positions and wherein said central processing unit may read the contents of a one of said plurality of addressable locations, and said memory also containing a single bit error correction/double bit error detection circuit wherein said single bit error correction/double bit error detection circuit can detect the presence of an error in said contents of said one of said plurality of addressable locations read by said central processing unit and wherein said single bit error detection/double bit error correction circuit can correct said error if said error effects only one of said plurality of bit positions, the improvement for correcting said error if said error effects more than one of said plurality of bit positions comprising:

means responsively coupled to said memory for temporarily storing a data word having a plurality of bit positions equal to said plurality of bit positions of said addressable locations of said memory;

test word generation means responsively coupled to said temporarily storing means for generating a first test data word and a second test data word wherein said second test data word is the compliment of said first test data word;

means responsively coupled to said temporarily storing means and said memory for writing said first test data word and said second test data word into one of said plurality of addressable locations read by said central processing unit;

means responsively coupled to said memory for reading the contents of said one of said plurality of addressable locations read by said central processing unit;

means responsively coupled to said reading means and said temporarily storing means for exclusive-ORing the contents of said temporarily storing means with the contents and the complement of the contents of said one of said plurality of addressable locations read by said central processing unit as supplied by said reading means wherein the resultant of said exclusive-ORing is temporarily stored in said temporarily storing means;

control means responsively coupled to said temporarily storing means, said test word generation means, said writing means, said reading means, said exclusive-ORing means, said single bit error correction/double bit detection circuit, and said memory for sequentially causing, if said error detected by said single bit error correction/double bit error detection circuit effects more than one of said plurality of bit positions, said reading means to reread said one of said plurality of addressable locations read by said central processing unit, said single bit error correction/double bit error detection circuit to verify that the contents of said one of said plurality of addressable locations as reread by said reading means contains said error effecting more than one of said plurality of bit positions, and, if said contents of said one of said plurality of addressable locations as reread by said reading means contains said error effecting more than one of said plurality of bit positions, said temporarily storing means to temporarily store said contents of said one of said plurality of addressable locations as reread by said reading means, said test word generation means to generate said first test data word, said writing means to write said first test word into said one of said plurality of addressable locations read by said central processing unit, said reading means to read the contents of said one of said plurality of addressable locations read by said central processing unit, said exclusive-ORing means to exclusive-OR said contents of said one of said plurality of addressable locations as read by said reading means with the contents of said temporarily storing means, said temporarily storing means to temporarily store the output of said exclusive-ORing means, said test word generation means to generate said second test data word, said writing means to write said second test data word into said one of said plurality of addressable locations read by said central processing unit, said reading means to read the contents of said one of said plurality of addressable locations read by said central processing unit, said exclusive-ORing means to exclusive-OR the compliment of said contents of said one of said plurality of addressable locations as read by said reading means with the contents of said temporarily storing means producing a corrected read data word, said temporarily storing means to temporarily store said corrected read data word, and said writing means to write said corrected read data word into said one of said plurality of addressable locations read by said central processing unit, means responsively coupled to said memory, said control means, said central processing unit, and said temporarily storing means for transferring corrected read data word to said central processing unit as if it were the contents of said one of said plurality of addressable locations of said memory read by said central processing unit; and means responsively coupled to said central processing unit and said control means for halting said central processing unit until said corrected read data word can be generated.

4. In a computer having a central processing unit and having a memory containing a plurality of addressable locations wherein said central processing unit may address a one of said plurality of addressable locations and containing means for detecting an error in the contents of said one of said plurality of addressable locations and containing means for generating test words, writing said test words into said memory, and reading said test words from said memory, and containing exclusive-OR means coupled to said generating writing and reading means for correcting said error in the contents of said one of said plurality of addressable locations, the method of correcting said error comprising:

halting said central processing unit to enable said error to be corrected;

saving the contents of said one of said plurality of said addressable locations containing said error;

writing a first test data word into said one of said plurality of addressable locations addressed by said central processing unit;

reading said one of said plurality of addressable locations addressed by said central processing unit to obtain a potentially modified first test data word;

exclusive-ORing said contents of said one of said plurality of said addressable locations containing said error with said potentially modified first test data word to produce a partially corrected data word;

writing the compliment of said first test data word into said one of said plurality of addressable locations addressed by said central processing unit;

reading said one of said plurality of addressable locations addressed by said central processing unit to obtain a potentially modified complimented first test data word;

exclusive-ORing said partially corrected data word with the compliment of said potentially modified complimented first test data word to produce a corrected read data word;

writing said corrected read data word into said one of said plurality of addressable locations addressed by said central processing unit; and supplying said read data word to said central processing unit as if it were the contents of said one of said plurality of addressable locations addressed by said central processing unit.

* * * * *

UNITED STATES PATENT AND TRADEMARK OFFICE
CERTIFICATE OF CORRECTION

PATENT NO. : 4,251,863

DATED : 2/17/81

INVENTOR(S) : Roland D. Rothenberger

It is certified that error appears in the above-identified patent and that said Letters Patent are hereby corrected as shown below:

IN THE ABSTRACT

Where "complimented" appears, change to --complemented--.

IN THE SPECIFICATION

Column 3, line 4, change "plimented" to --plemented--.

Column 3, line 7, change "compliment" to --complement--.

Column 3, line 10, change "complimented" to --complemented--.

Column 8, line 33, change "compliment" to --complement--.

Column 8, line 54, change "compliment" to --complement--.

Column 10, line 11, change "compliment" to --complement--.

IN THE CLAIMS

Claim 1, Column 10, line 40, change "compli" to --comple--.

Column 11, line 26, change "compliment" to --complement--.

Claim 3, Column 11, line 67, change "compli-" to --comple--.

Column 12, line 61, change "compliment" to --complement--.

Claim 4, Column 14, line 12, change "compliment" to --complement--.

UNITED STATES PATENT AND TRADEMARK OFFICE
CERTIFICATE OF CORRECTION

PATENT NO. : 4,251,863          Page 2 of 2
DATED : 2/17/81
INVENTOR(S) : Roland D. Rothenberger It is certified that error appears in the above-identified patent and that said Letters Patent are hereby corrected as shown below:

Claim 4, continued.

Column 14, line 17, change "complimented" to --complemented--.
Column 14, line 20, change "compliment" to --complement--.
Column 14, line 21, change "complimented" to --complemented--.

Claim 3, Column 12, line 4, change "one of said" to --said one of said--.

Signed and Sealed this

First Day of September 1981

[SEAL]

Attest:

GERALD J. MOSSINGHOFF

Attesting Officer     Commissioner of Patents and Trademarks